(12) United States Patent
Appenzeller et al.

(10) Patent No.: US 10,756,263 B2
(45) Date of Patent: Aug. 25, 2020

(54) PHASE TRANSITION BASED RESISTIVE RANDOM-ACCESS MEMORY

(71) Applicants: Purdue Research Foundation, West Lafayette, IN (US); Gov. of the U.S. as Represented by Sec. of Comm. National Institute of Standards and Technology, Gaithersburg, MD (US)

(72) Inventors: Joerg Appenzeller, West Lafayette, IN (US); Feng Zhang, West Lafayette, IN (US); Yuqi Zhu, West Lafayette, IN (US); Albert V. Davydov, North Potomac, MD (US); Sergiy Krylyuk, Montgomery Village, MD (US); Huairuo Zhang, Gaithersburg, MD (US); Leonid A. Bendersky, Montgomery Village, MD (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/110,376

(22) Filed: Aug. 23, 2018

(65) Prior Publication Data

US 2019/0363250 A1 Nov. 28, 2019

Related U.S. Application Data

(63) Continuation-in-part of application No. 15/987,867, filed on May 23, 2018, now Pat. No. 10,505,109.

(51) Int. Cl.
G11C 11/00 (2006.01)
H01L 45/00 (2006.01)
G11C 13/00 (2006.01)

(52) U.S. Cl.
CPC .......... H01L 45/06 (2013.01); G11C 13/0004 (2013.01); G11C 13/0038 (2013.01);
(Continued)

(58) Field of Classification Search
CPC . H01L 45/06; H01L 45/1253; H01L 45/1608; H01L 45/141; H01L 45/1246;
(Continued)

(56) References Cited

U.S. PATENT DOCUMENTS

2010/0074001 A1* 3/2010 Kubo .................... B82Y 10/00
                                                    365/163
2017/0047512 A1* 2/2017 Bessonov ................ H01G 7/06

OTHER PUBLICATIONS

Appenzeller et al., Chapter 8:Transition Metal Dichalcogenide Schottky Barrier Transistors—A Device Analysis and Material Comparison, 2D Materials for Nanoelectronics, 2016, 207-240, CRC Press/Taylor & Francis Group, LLC.
(Continued)

Primary Examiner — Tha-O H Bui
(74) Attorney, Agent, or Firm — Piroozi-IP, LLC

(57) ABSTRACT

A method of switching a phase-change device (Device), including changing phase of the Device from a semiconducting 2H phase to a new $2H_d$ phase with a higher conductivity, the Device having an active material with a thickness including a phase transition material to thereby transition the Device from a high resistive state (HRS) to a low resistive state (LRS) by application of a set voltage and further to return the Device from the LRS back to the HRS by application of a reset voltage.

8 Claims, 20 Drawing Sheets

(52) U.S. Cl.
CPC ........ *H01L 45/1253* (2013.01); *H01L 45/141* (2013.01); *H01L 45/1608* (2013.01)

(58) Field of Classification Search
CPC . H01L 45/1233; H01L 45/142; H01L 45/143; H01L 45/144; H01L 45/065; G11C 13/0038; G11C 13/0004; G11C 13/0069; G11C 2013/0092; G11C 2013/0083; G11C 2213/15; G11C 2213/54; G11C 2013/009; G11C 13/0016; G11C 13/0007; G11C 11/56
USPC ........................................................ 365/163
See application file for complete search history.

(56) References Cited

OTHER PUBLICATIONS

Zhang et al., Electric field induced semiconductor-to-metal phase transition in vertical MoTe2 and Mo1-xWxTe2 devices. 2017, arXiv preprint arXiv:1709.03835.
Wong et al., Metal-oxide RRAM, 2012, 1951-1970, vol. 100, No. 6, Proc. IEEE.
Yang et al., Memristive devices for computing, 2013, vol. 8., 13-24, Nature Nanotech.
Zhu et al., Vertical charge transport through transition metal dichalcogenides—a quantitative analysis. 2017, 9, 19108-19113, Nanoscale.

* cited by examiner

US 10,756,263 B2

PHASE TRANSITION BASED RESISTIVE RANDOM-ACCESS MEMORY

CROSS-REFERENCE TO RELATED APPLICATIONS

The present patent application is a continuation-in-part application which is related to and claims the priority benefit of U.S. Non-Provisional Ser. No. 15/987,867 filed May 23, 2018, the contents of each of which are hereby incorporated by reference in their entirety into the present disclosure.

STATEMENT REGARDING GOVERNMENT FUNDING

This invention was made with government support under HR0011-13-3-0002 awarded by the Department of Defense/Defense Advanced Research Projects Agency (DARPA). The government has certain rights in the invention.

TECHNICAL FIELD

The present disclosure generally relates to memory devices, and in particular, to resistive random-access memory (RRAM) cells.

BACKGROUND

This section introduces aspects that may help facilitate a better understanding of the disclosure. Accordingly, these statements are to be read in this light and are not to be understood as admissions about what is or is not prior art.

Resistive random-access memory (RRAM)-based technology has gained attention of the semiconductor industry and researchers working at the forefront of emerging technologies due to its potential scalability, high operation speed, high endurance and ease of process flow. RRAM devices are typically two-terminal cells whose operation are based on changing the resistive state of an internal element to thereby store information in a nonvolatile fashion by applying a sufficiently high voltage or by driving a large enough current through the cell.

Typically, two types of switching mechanisms are distinguished in RRAM devices. According to one type, valence change memory (VCM), oxide-based resistive random-access memory cells follow a resistive switching mechanism in which a cluster of localized valence changes lead to formation of a filament from a high resistive state to a low resistive state resulting in the electromigration of induced anions which modifies the valence states of the cations. According to another type, RRAM devices operating based on the electrochemical metallization rely on the anodic dissolution (oxidation) of an active metal electrode and electrodeposition (reduction) of the metal ions inside the active switching material.

However, the observed RRAM behavior in both of the above described instances involves an uncontrollable movement of individual atoms. Accordingly, reliability aspects represent a substantial challenge.

Therefore, there is an unmet need in the art for a new switching mechanism that can be used in RRAM cells and systems.

SUMMARY

A method of switching a phase-change device (Device) is disclosed. The method changing phase of the Device from a semiconducting 2H phase to a new 2Hd phase with a higher conductivity, the Device having an active material with a thickness including a phase transition material to thereby transition the Device from a high resistive state (HRS) to a low resistive state (LRS) by application of a set voltage and further to return the Device from the LRS back to the HRS by application of a reset voltage.

DETAILED DESCRIPTION

Figure 1:
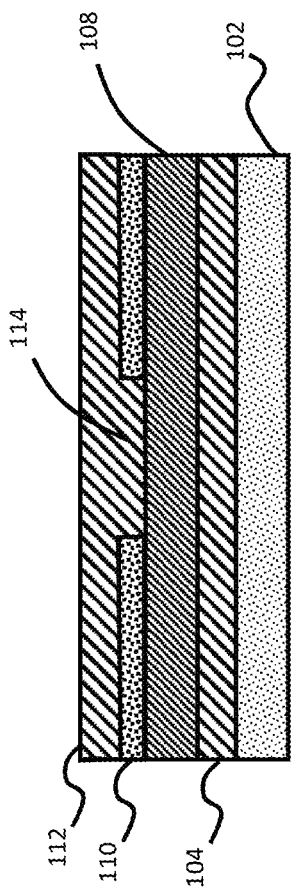
FIG. 1 is a schematic view of a cross section of a resistive random-access memory (RRAM) cell according to the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel switching mechanism that can be used in resistive random-access memory (RRAM) cells and systems is disclosed. A method for fabricating this novel switching mechanism is also provided.

The present disclosure relates to a new switching mechanism in RRAM devices and fabrication thereof. The active material is made from phase transition materials, e.g. $MoTe_2$, $Mo_{1-x}W_xTe_2$, GaTe, $ReSe_2$, $ReS_2$, or other such materials known to a person having ordinary skill in the art. These classes of materials may be used in fabrication of neuromorphic computing, in-memory computing or memristor-based nonvolatile logic circuits and devices.

The RRAM topology described in the present disclosure is based on a class of electric field induced phase transition materials (also referred to as the active material, herein). By applying an electrical field to this active material, the cell is transformed from a high resistive state (HRS) to a low resistive state (LRS). This transformation can be viewed as setting the cell to a value of "1". By reversing the electrical field, the cell can be transformed from the LRS back to the HRS, i.e., resetting the cell back to "0".

Figure 7:
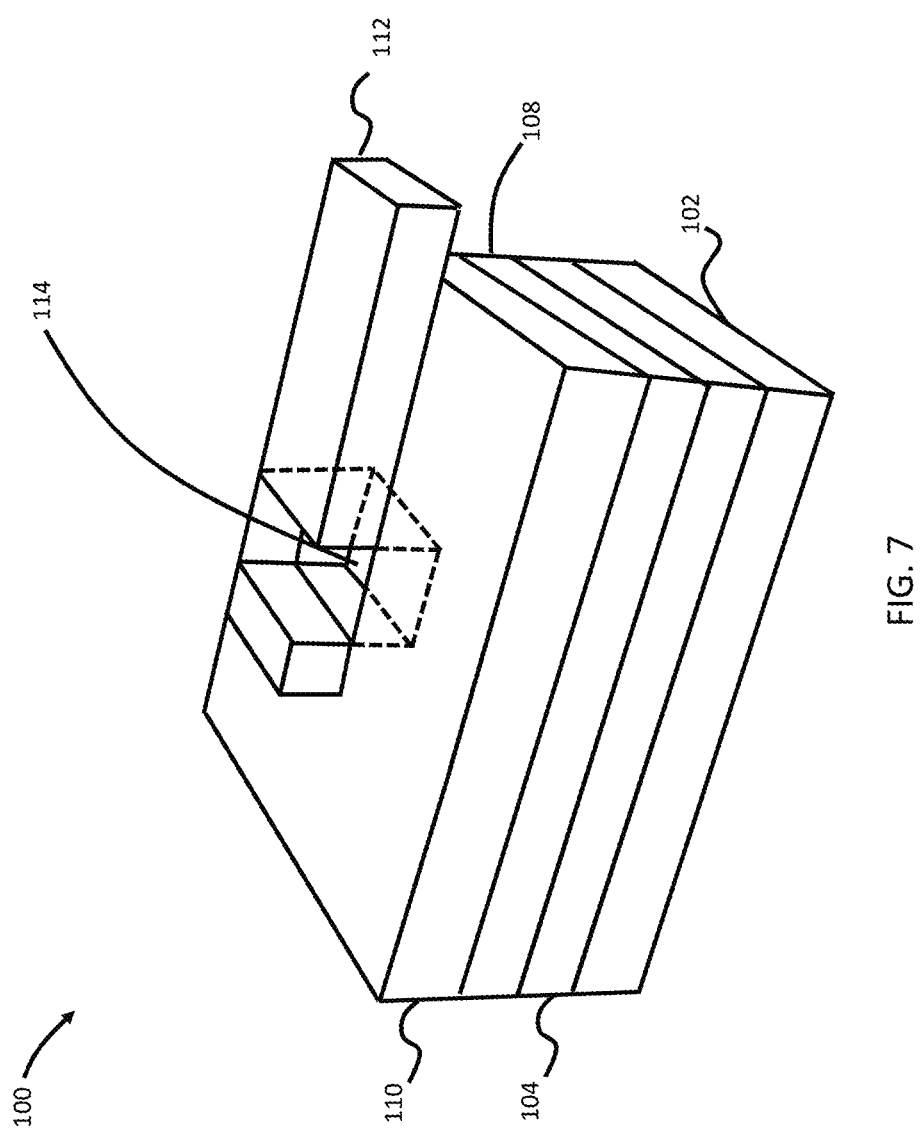
FIG. 7 is a perspective schematic of a vertical transition metal dichalcogenide (TMD) RRAM device of FIG. 1.

Now referring to FIG. 1, an exemplary embodiment of a cell 100 according to the present disclosure is provided. The cell 100 includes a substrate 102, a first electrode 104 formed atop the substrate 102 and an active material 108 formed atop the first electrode 104. On the active material (also referred to as the active material layer) 108 is an isolation layer 110 atop and within which is a second electrode 112 formed. The first electrode 104 and the second electrode 112 provide electrical connectivity to the cell 100. A perspective view of the cell 100 is shown in FIG. 7 representing one exemplary embodiment of the second 112 electrode and its disposition with respect to the active material layer 108 and the isolation layer 110.

The substrate 102 in FIG. 1 can be made from a variety of suitable materials known to a person having ordinary skill in the semiconductor art. For example, the substrate 102 can be made from silicon, silicon dioxide, glass, sapphire, germanium, gallium arsenide, indium phosphate, alloys of silicon and germanium, titanium oxide, single polymer, such as polyethylene (PE), biaxially oriented polypropylene (BOPP), polyethylene terephthalate (PET), polyvinyl chloride (PVC) and the like including flexible substrates. The electrodes 104 and 112 are made from typical material suitable for electrodes known to a person having ordinary skill in the semiconductor art. For example, the electrodes 104 and 112 can be made from aluminum, copper, gold, silver, polysilicon, molybdenum, nickel, indium tin oxide (ITO), graphene, carbon nanotubes (CNT), silver nanowires (AgNWs), conductive polymer and the like including flexible conductors. The electrodes 104 and 112 are formed by, e.g., deposition, e.g., by chemical vapor deposition (CVD), e.g., thermal CVD or plasma-enhanced CVD; or physical vapor deposition (PVD), e.g., sputtering or evaporation. The electrodes 104 and 112 make Schottky contact between the electrode material and the neighboring semiconductor material.

The active material 108 is formed on the first electrode 104. The active material 108 is made from electric field induced phase transition materials, e.g. $MoTe_2$, $Mo_{1-x}W_xTe_2$, GaTe, $ReSe_2$, $ReS_2$, or other such materials known to a person having ordinary skill in the art. The phase transition materials discussed herein can change phase based on inducement of electric field, by joules heating, or a combination thereof. Suitable methods for forming the active material 108 include CVD growth or exfoliated from bulk materials. The thickness of the active material layer 108 depends on what set/reset voltage RRAM devices require as will be discussed below. However, suffice it to say that according to one embodiment of the present disclosure the thickness is between about 0.6 nm and 40 nm.

The isolation layer 110 is used to ensure that only vertical transport occurs from the first electrode 104 to the second electrode 112 without any lateral transport contributions. The thickness of the isolation layer 110 depends on the applied voltage (described in FIG. 3) to ensure that no leakage current exists in the chosen layout. An open window 114 can be formed in the isolation layer 110 which size depends on the need of device area. The isolation layer 110 may be formed from silicon dioxide ($SiO_2$), boron nitride (BN) or metal oxide materials, such as aluminum oxide ($Al_2O_3$), hafnium dioxide ($HfO_2$), other two-dimensional (2D) insulators that do not undergo a phase transition, or polymers and other isolation material used in the semiconductor industry known to a person having ordinary skill in the art. The open window 114 can be formed by first applying a selective protective (resist) layer and then applying a buffered hydrofluoric acid (HF) to dissolve unprotected regions of the isolation material in case of $SiO_2$. The photoresist is removed by a chemical solution or by oxidizing in an oxygen plasma or a UV ozone system, as known to a person having ordinary skill in the art. An alternative way is reactive-ion etching (RIE), known to a person having ordinary skill in the art.

The window 114 allows electrical contact between the second electrode 112 and the active material layer 108. While a window is shown, it should be appreciated that a network of vias can also be used, as known to a person having ordinary skill in the art. In one embodiment, the window 114 can be sized as small as the minimum feature size of the technology utilized, however, according to one embodiment between about 20 nm to about 2 μm in width and about 20 nm to about 2 μm in length. Alternatively, a network of vias providing substantially the same amount of surface area can also be used.

Figure 2:
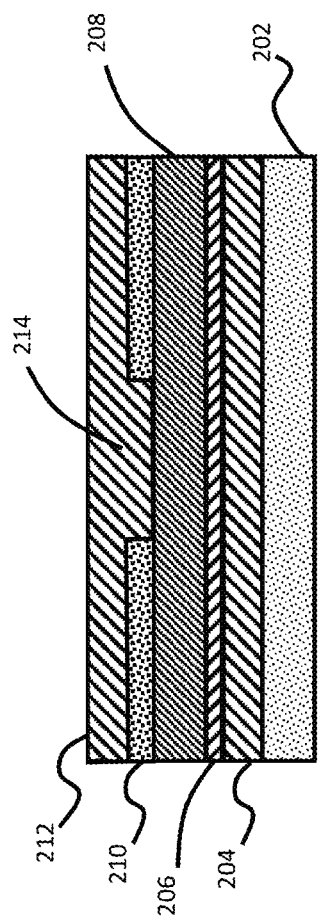
FIG. 2 is a schematic view of a cross section of another RRAM cell according to the present disclosure.

Referring to FIG. 2, another exemplary embodiment of a cell 200 according to the present disclosure is provided. The cell 200 includes a substrate 202, a first electrode 204 formed atop the substrate 202 and a tunneling barrier layer 206 formed atop the first electrode 204. The tunneling barrier 206 works to reduce the set/reset current level in the device 200, as will be discussed in greater detail below. The tunneling barrier 206 may be formed from silicon dioxide ($SiO_2$) or metal oxide materials, such as aluminum oxide ($Al_2O_3$), hafnium dioxide ($HfO_2$), boron nitride (BN), other two-dimensional (2D) materials such as $MoS_2$, $WSe_2$, $MoSe_2$ and the like including 2D insulators that do not undergo a phase transition. The thickness of the tunneling barrier 206 depends on the requirement of set/reset current levels. Atop the tunneling barrier layer 206 is a layer of active material 208. Atop the active material (also referred to as the active material layer) 208 is an isolation layer 210 atop which is a second electrode 212 formed. The first electrode 204 and the second electrode 212 provide electrical connectivity to the cell 200. The tunneling barrier layer 206 and the active material layer 208 can swap positions. Additionally, the tunneling barrier layer 206 can be provided on both sides of the active material layer 208 referring to a construction including the first electrode 204—the tunneling layer 206—the active material layer 208—the tunneling layer 206.

The substrate 202 can be made from a variety of suitable materials known to a person having ordinary skill in the semiconductor art. For example, the substrate 202 can be made from silicon, silicon dioxide, glass, sapphire, germanium, gallium arsenide, indium phosphate, alloys of silicon and germanium, titanium oxide, single polymer, such as polyethylene (PE), biaxially oriented polypropylene (BOPP), polyethylene terephthalate (PET), polyvinyl chloride (PVC) and the like including flexible substrates. The electrodes 204 and 212 are made from typical materials suitable for electrodes known to a person having ordinary skill in the semiconductor art. For example, the electrodes 204 and 212 can be made from aluminum, copper, gold, silver, polysilicon, molybdenum, nickel, indium tin oxide (ITO), graphene, carbon nanotubes (CNT), silver nanowires (AgNWs), conductive polymer, and the like including flexible conductors. The electrodes 204 and 212 are formed by, e.g., deposition, e.g., by chemical vapor deposition (CVD), e.g., thermal CVD or plasma-enhanced CVD; or physical vapor deposition (PVD), e.g., sputtering or evaporation. The electrodes 204 and 212 make Schottky contacts between the electrode material and the neighboring semiconductor material.

The active material 208 is formed on the first electrode 204. The active material 208 is made from electric field induced phase transition materials, e.g. $MoTe_2$, $Mo_{1-x}W_xTe_2$, GaTe, $ReSe_2$, $ReS_2$, or other such materials known to a person having ordinary skill in the art. Suitable methods for forming the active material 208 include CVD growth or exfoliated from bulk materials. The thickness of the active material layer 208 depends on what set/reset voltage RRAM devices require as will be discussed below. However, suffice it to say that according to one embodiment of the present disclosure the thickness is between about 0.6 nm and 40 nm.

The isolation layer 210 is used to ensure that only vertical transport occurs from the first electrode 204 to the second electrode 212 without any lateral transport contributions. The thickness of the isolation layer 210 depends on the applied voltage (described in FIG. 3) to ensure that no leakage current exists in the chosen layout. An open window 214 can be formed in the isolation layer 210 which size depends on the need of device area. The isolation layer 210 may be formed from silicon dioxide ($SiO_2$), boron nitride (BN) or metal oxide material, such as aluminum oxide ($Al_2O_3$), hafnium dioxide ($HfO_2$), or polymers, and other isolation material used in the semiconductor industry known to a person having ordinary skill in the art. The open window 214 can be formed by first applying a selective protective (resist) layer and then applying a buffered hydrofluoric acid (HF) to dissolve unprotected regions of the isolation material in case of $SiO_2$. The photoresist is removed by a chemical solution or by oxidizing in an oxygen plasma or a UV ozone system, as known to a person having ordinary skill in the art.

The window 214 allows electrical contact between the second electrode 212 and the active material layer 208. While a window is shown, it should be appreciated that a network of vias can also be used, as known to a person having ordinary skill in the art. In one embodiment, the window 214 can be sized between about 20 nm to about 2 μm in width and about 20 nm to about 2 μm in length in length. Alternatively, a network of vias providing substantially the same amount of surface area can also be used.

Figure 3:
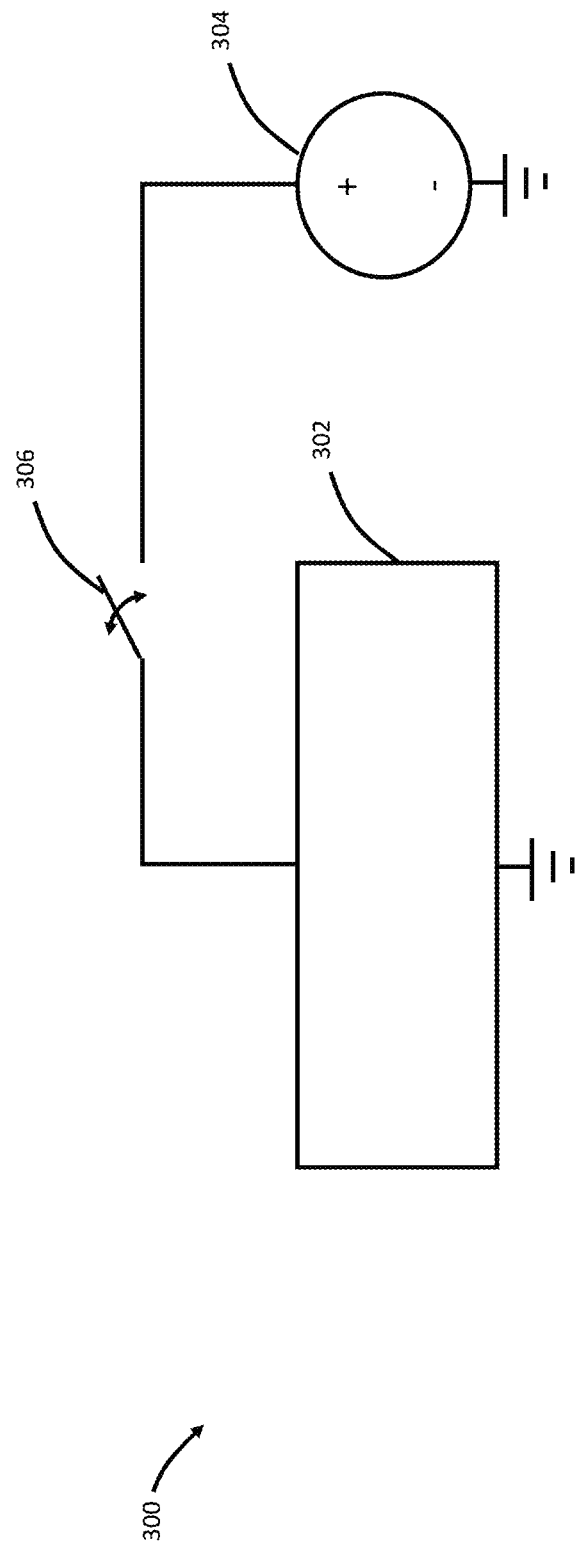
FIG. 3 is a schematic of a system, according to the present disclosure, where a cell according to the present disclosure is coupled to a selectable source via a switch.

Referring to FIG. 3, a system 300 is shown where a cell 302 is coupled to a selectable source 304 via a switch 306. The source 304 is configured to provide a positive and a negative voltage in order to set and reset the cell 302. The cell 302 as described above can be any of the exemplary embodiments 100 or 200. The switch 306 isolates the device 302 from the source 304, allowing the device 302 to remain in its non-volatile state. In operation, the source 304 applies controlled positive potentials or alternatively negative potentials) to the second electrode (112 or 212 in FIG. 1 or 2). Note that the cell 302 shown may be part of a larger cross bar geometry or other high-density memory array.

Figure 4:
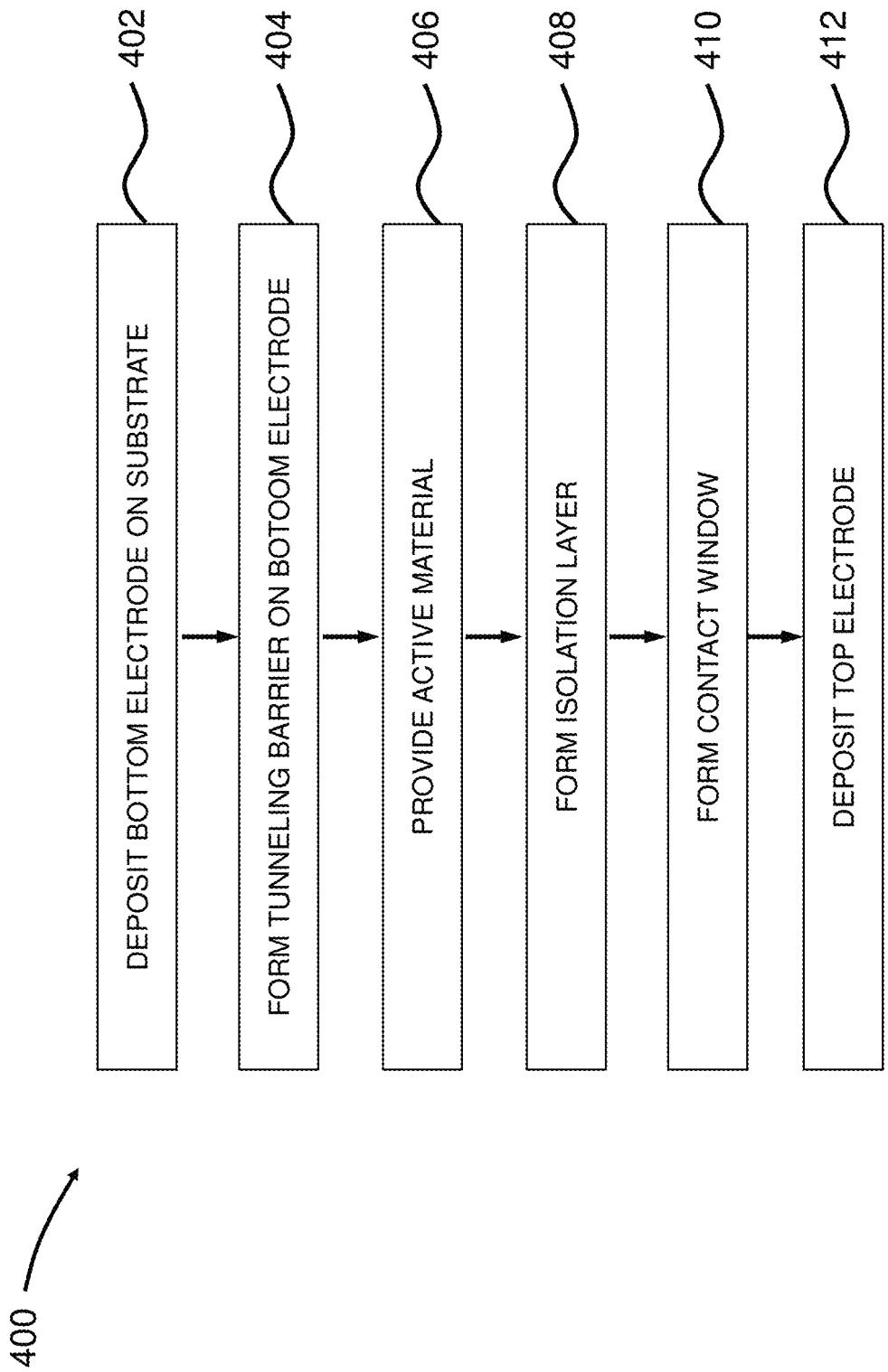
FIG. 4 is a flowchart depicting a method that represents an exemplary process for making the cells, according to the present disclosure.

Referring to FIG. 4, a method 400 is shown that represents an exemplary process for making the cells 100 and 200, according to the present disclosure. The method 400 is based on a flow diagram for one embodiment of the present disclosure of fabricating phase transition-based RRAMs. The method 400 includes process steps that are performed upon a substrate (102, 202 in FIGS. 1 and 2). In one illustrative embodiment, such processing steps are sequentially performed in the depicted order. In alternate embodiments, at least two processing steps may be performed contemporaneously or in a different order. For the device without tunneling barriers (e.g., the device 100 of FIG. 1), the step 404 of FIG. 4 is eliminated. Conventional sub-processes, such as application and removal of lithographic masks or sacrificial and protective layers, cleaning processes, and the like, are well known in the art and are not shown in the method 400. At step 402 of FIG. 4, a first electrode (104 or 204 in FIG. 1 or 2) is formed on the substrate (102 or 202 in FIG. 1 or 2).

At step 406 of FIG. 4, the active material layer (108 or 208 in FIG. 1 or 2) is formed on the first electrode (104 or 204 in FIG. 1 or 2). Methods suitable for forming such active material layer, e.g. $MoTe_2$, $Mo_{1-x}WxTe_2$, GaTe, $ReSe_2$, $ReS_2$, are CVD growth or exfoliated from bulk materials. The thickness of the active layer (108 or 208 in FIG. 1 or 2) depends on set/reset voltage which RRAM devices require, as described in fuller detail below. At step 408 of FIG. 4, an isolation layer (110 or 210 in FIG. 1 or 2) is formed upon the active material layer (108 or 208 in FIG. 1 or 2). The isolation layer (110 or 210 in FIG. 1 or 2) is used to ensure that only vertical transport occurs from the first electrode (104 or 204 in FIG. 1 or 2) to the second electrode (112 or 212 in FIG. 1 or 2) without any lateral transport contributions. The thickness of the isolation layer (110 or 210 in FIG. 1 or 2) depends on the voltage of the voltage source 304 (shown in FIG. 3) to ensure that no leakage current exists in the chosen layout. At step 410 of FIG. 4, a contact window (114 or 214 in FIG. 1 or 2) is formed in isolation layer (110 or 210 in FIG. 1 or 2) upon the active material layer (108 or 208 in FIG. 1 or 2). The window allows electrical contact between the second electrode (112 or 212 in FIG. 1 or 2) and the active material layer (108 or 208 in FIG. 1 or 2).

At step 412 of FIG. 4, the second electrode (112 or 212 in FIG. 1 or 2) is formed upon the isolation layer (110 or 210 in FIG. 1 or 2), coupling to the active material layer (108 or 208 in FIG. 1 or 2). The first electrode (104 or 204 in FIG. 1 or 2) and the second electrode (112 or 212 in FIG. 1 or 2) may be formed from at least one conductive material (e.g., a metal, an alloy of the metal, or a conductive compound) that is compatible with respective underlying and overlying material layers, as discussed above. In step 404 of FIG. 4, the tunneling barrier layer (206 in FIG. 2) is formed upon the first electrode (204 in FIG. 2) to reduce the set/reset current level in device 200. The tunneling barrier layer (206 in FIG. 2) may be formed from silicon dioxide ($SiO_2$) or metal oxide materials, such as aluminum oxide ($Al_2O_3$), hafnium dioxide ($HfO_2$), boron nitride (BN), other two-dimensional (2D) materials such as $MoS_2$, $WSe_2$, $MoSe_2$, and the like including 2D insulators that do not undergo a phase transition or polymers and other isolation material used in the semiconductor industry known to a person having ordinary skill in the art. The thickness of the tunneling barrier (206 in FIG. 2) depends on the requirement of set/reset current levels. In one exemplary embodiment, the tunneling barrier (206 in FIG. 2) comprises 4.5 nm thick aluminum oxide ($Al_2O_3$). A 3 nm thick aluminum (Al) layer was deposited onto the first electrode (204 in FIG. 2) prior to oxidation of the Al in an oxygen rich environment at around 250° C. for 6 h. The set/reset current for this embodiment is $10^{-7}$ A for the LRS at 3V. It should be appreciated that the structures discussed herein are symmetrical with respect to the first electrode (104 or 204 in FIG. 1 or 2) and the second electrode (112 or 212 in FIG. 1 or 2). Therefore, the same procedures and structures discussed can be repeated with the tunneling barrier layer (206 in FIG. 2) being formed against the second electrode (212 in FIG. 2).

Figure 5:
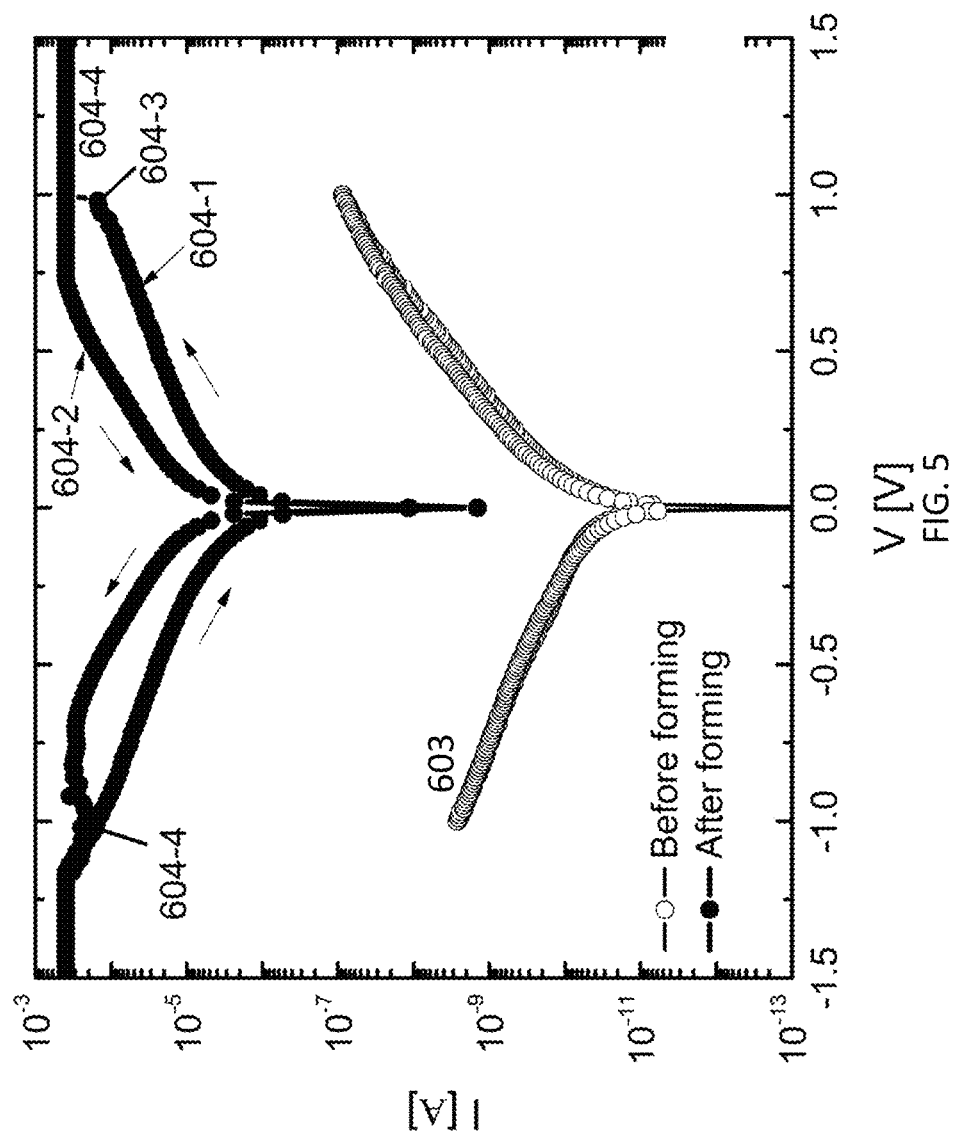
FIG. 5 is an exemplary IV graph illustrating characteristics of the RRAM device of FIG. 1 for a vertical $MoTe_2$ device.

Referring to FIG. 5, an exemplary IV graph illustrating characteristics of the RRAM device of FIG. 1 is provided for a vertical $MoTe_2$ device from a flake with a thickness of about 10 nm. More specifically, the graphs in FIG. 5 show the dependence of current I on the applied voltage V initially in an unformed state 603 as shown by a curve of hollow circles and then the device transitioning to a formed state 604 including a high resistance state (HRS) 604-1 and a low resistive state (LRS) 604-2 as shown by a curve of solid circles. The characteristic 603 of FIG. 1 is reproducible and substantially does not change after multiple scans between −1 V and 1 V as shown by hollow circles. The situation however changes when the voltage range is extended to a forming voltage. While not fully shown in FIG. 5, the forming voltage $V_{Forming}$ is described in fuller detail below. The cell 100 of FIG. 1 can transition into a formed state 604 and remain in that state indefinitely as illustrated. The formed state includes a set voltage represented by 604-3 at which point the cell 100 transitions from the HRS 604-1 to LRS 604-2 and a reset voltage 604-4 at which point the cell 100 transitions from the LRS 604-2 back to the HRS 604-1. Once the cell 100 is transitioned into the formed state 604, it remains in that state indefinitely and by sweeping the voltage it can be set and reset (i.e., transition from the HRS 604-1 to LRS 604-2 and back to HRS 604-1). The set voltage depends on the active material layer 108 thickness. In the depicted embodiment, the cell 100 has a set voltage $V_{SET}$ of between about 1 V to about 1.2 V. After the forming event, device characteristics can be cycled to exhibit typical bipolar RRAM type of behavior in terms of: a) remaining in their LRS 604-2 when no voltage is applied, b) preserving the low resistive state over an appreciable voltage range until a sufficient reset voltage (here $V_{RESET}$ is between about −0.9 V and −1.1 V) of polarity opposite to the set voltage is reached, and c) remaining in their respective HRS 604-1 until the set voltage is reached. Note, the device can be formed by negative voltage, then the set voltage polarity would be negative and reset voltage polarity would be positive. It should be appreciated that the entirety of the cycle described herein could have started with negative voltages instead of positive voltages resulting in negative set and reset negative voltages.

Figure 6:
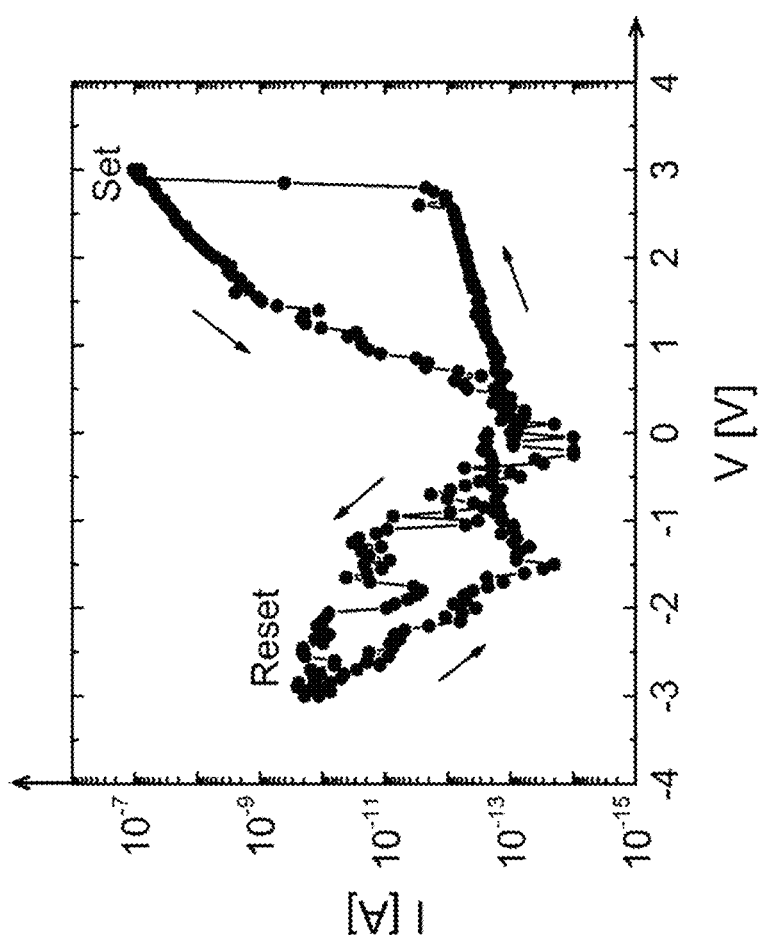
FIG. 6 is an exemplary IV graph illustrating characteristics of the RRAM device of FIG. 2.

Referring to FIG. 6, an exemplary IV graph illustrating characteristics of the cell 200 (shown in FIG. 2) is provided. More specifically, the graph in FIG. 6 shows dependence of current I from the applied voltage V. With the tunneling barrier 206 (see FIG. 2) in place, the current I through the cell 200 is reduced to 0.1 μA (shown in FIG. 6) in the depicted embodiment for the LRS at 3V. The cell 200 is set into LRS without the transitioning from an unformed state into a formed state described above with respect to FIG. 5 (called forming-free) and the LRS does not require introducing any current compliance through an external circuitry (not shown, however, can be accomplished by a semiconductor parameter analyzer or even by a simple circuit including a biased transistor or a switching field effect transistor, as known to a person having ordinary skill in the art), another desirable feature in RRAM cells. The set/reset voltage depends on the thicknesses of the active layer material 208 and the tunneling barrier 206. It should be appreciated that wherever in the present disclosure samples are discussed with respect to the forming process, that such samples refer to FIGS. 1 and 7, in which no tunneling barrier layer 206 (see FIG. 2) exists. However, where samples are discussed with such tunneling barrier 206, those portions refer to samples whereby no forming is needed.

Figure 8A:
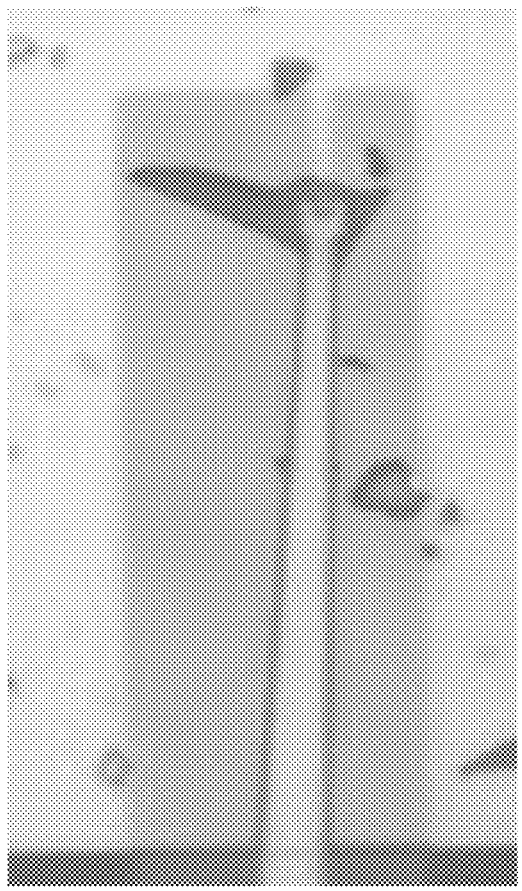
FIG. 8A is an optical image of the cell shown in FIG. 7.
Figure 8B:
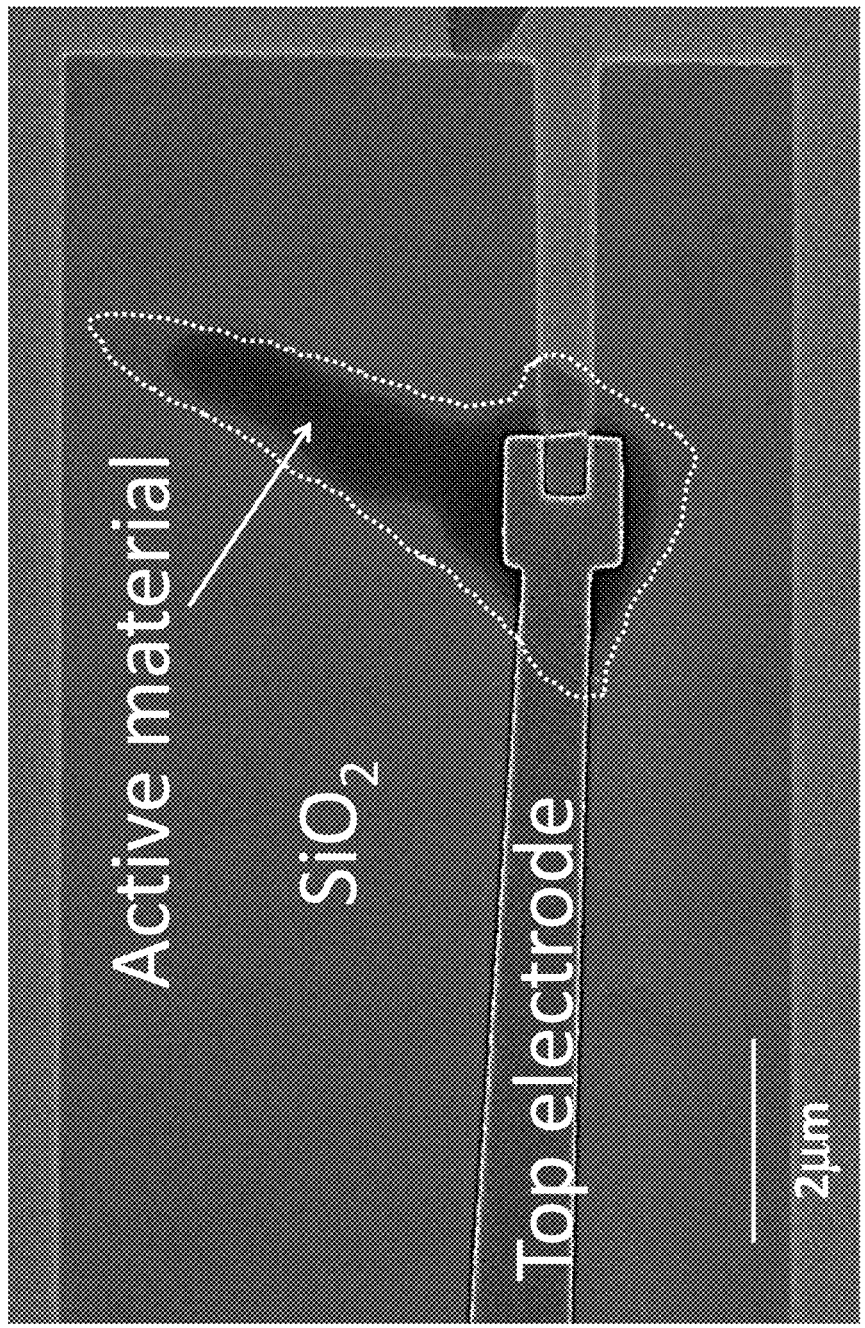
FIG. 8B is a scanning electron microscopy (SEM) image of the cell shown in FIG. 7.
Figure 9:
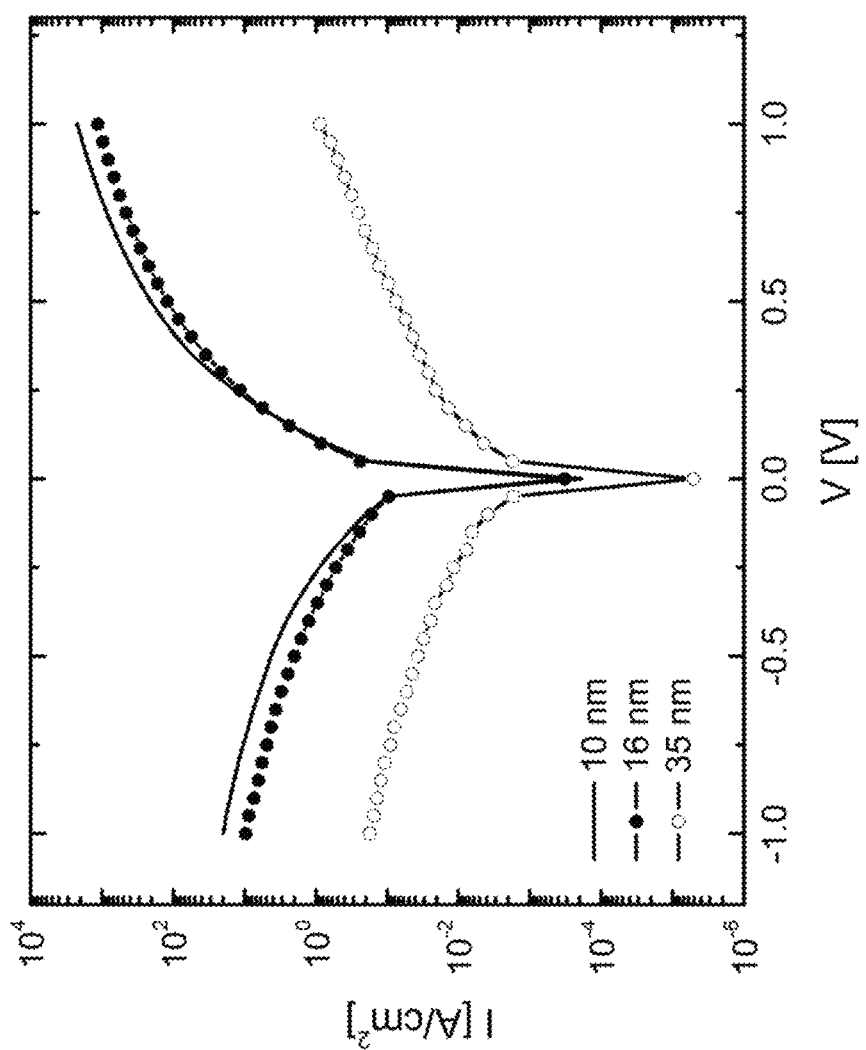
FIG. 9 is a graph of current (I) in $A/cm^2$ vs. voltage (V) in volts representing normalized IV curves of an exemplary pristine vertical $MoTe_2$ device lacking tunneling barriers.

Referring to FIG. 7, a perspective schematic of a vertical transition metal dichalcogenide (TMD) RRAM device also shown in FIG. 1 is shown, according to the present disclosure. Correspondingly, referring to FIGS. 8A and 8B optical and scanning electron microscopy (SEM) images of the cell shown in FIG. 7 are shown, respectively. The second electrode 112 (FIG. 7) contact area is between about 0.01 μm² to about 0.5 μm² according to one exemplary embodiment. The cell shown in FIG. 7 ensures that only vertical transport occurs from the first electrode 104 to the second electrode 112 without any lateral transport contributions. Because of the large aspect ratio between the second electrode 112 area and the flake thickness of the active material 108, spreading resistance contributions can be ignored and the active device area is substantially identical to the top contact area. Referring to FIG. 9 area normalized IV curves of exemplary vertical $MoTe_2$ device before forming are shown for devices lacking a tunneling barrier (example cell 100 in FIG. 1). The first electrode (104 in FIG. 1) is grounded. The results shown confirm the expected trend of current densities with thickness, i.e., the thinner the flakes the higher current densities. The device characteristics shown are reproducible and they remain substantially the same after several scans between −1 V and 1 V. However, when the voltage range is extended beyond −1 V to 1 V, the results change. In particular, vertical $MoTe_2$ TMD devices transition into LRS as discussed in FIG. 5.

The details on the forming process are discussed below. As long as a critical forming voltage which depends on TMD thickness is not reached, the pristine metal-$MoTe_2$-metal devices exhibit reproducible IV curves shown as hollow circles in FIG. 5. Progressing beyond this forming voltage results in the RRAM behavior as described above, resulting in the resistive switching behavior. Two factors contribute to the forming: external electric fields and Joule heating are both factors during the formation of conductive filaments. However, once a filament is formed, a voltage lower than the forming voltage (i.e., a set voltage) is used to switch between the HRS and LRS of the cell. A transition back to the HRS occurs when a reverse polarity electric field is applied, due to a rupture of filaments. It should be appreciated that the set voltage discussed here depends monotonically on the flake thickness for flakes with thicknesses below about 15 nm (see FIG. 11C) necessitating in that a critical electric field is needed to trigger the memristive behavior. Set voltages vary for the same flake thickness experimentally by about 0.2 V, which is a result of the prototype fabrication approach used, but is expected to be reduced by proper sample processing in a large fab. It should also be appreciated that after the aforementioned forming process has occurred, the state defined by the HRS remains more conductive than the original state of the device (i.e., solid circles in HRS 604-1 state are higher on the current curve than hollow circles representing pre-formation in FIG. 5) which is indicative that a permanent electronic change has occurred in the device. Along the same line, with reference to FIG. 5, the current ratio between the HRS and the LRS is about 50 but can be between about 10 and about 100 when the compliance is set to about 400 µA.

Figure 10A:
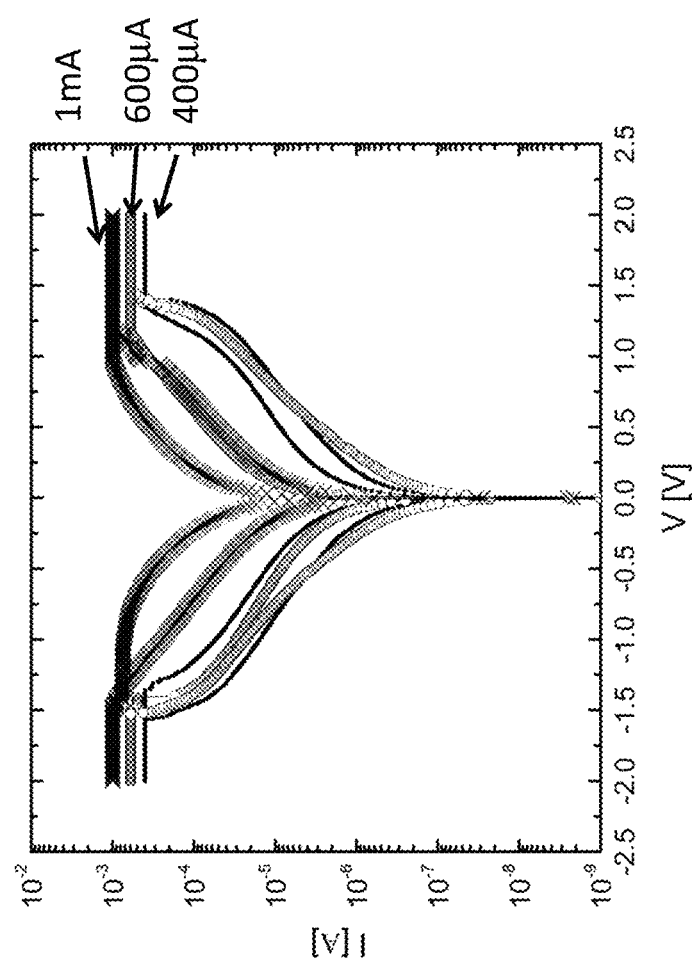
FIG. 10A is a graph of an exemplary IV graph illustrating current compliance characteristics of a $MoTe_2$-based RRAM device.
Figure 10B:
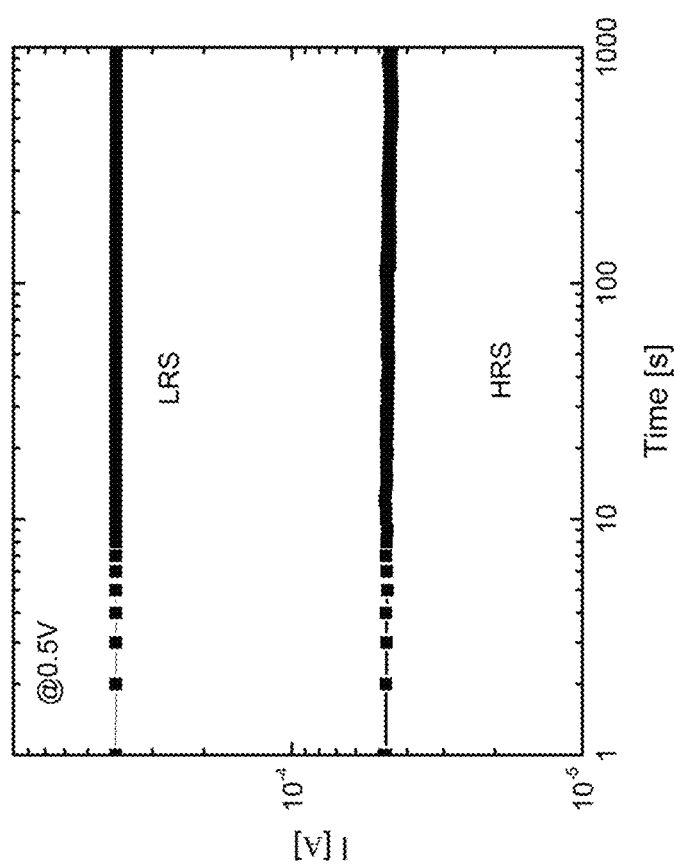
FIG. 10B is a graph of an exemplary current vs. time graph showing read disturb measurements on a representative $MoTe_2$ device.
Figure 11A:
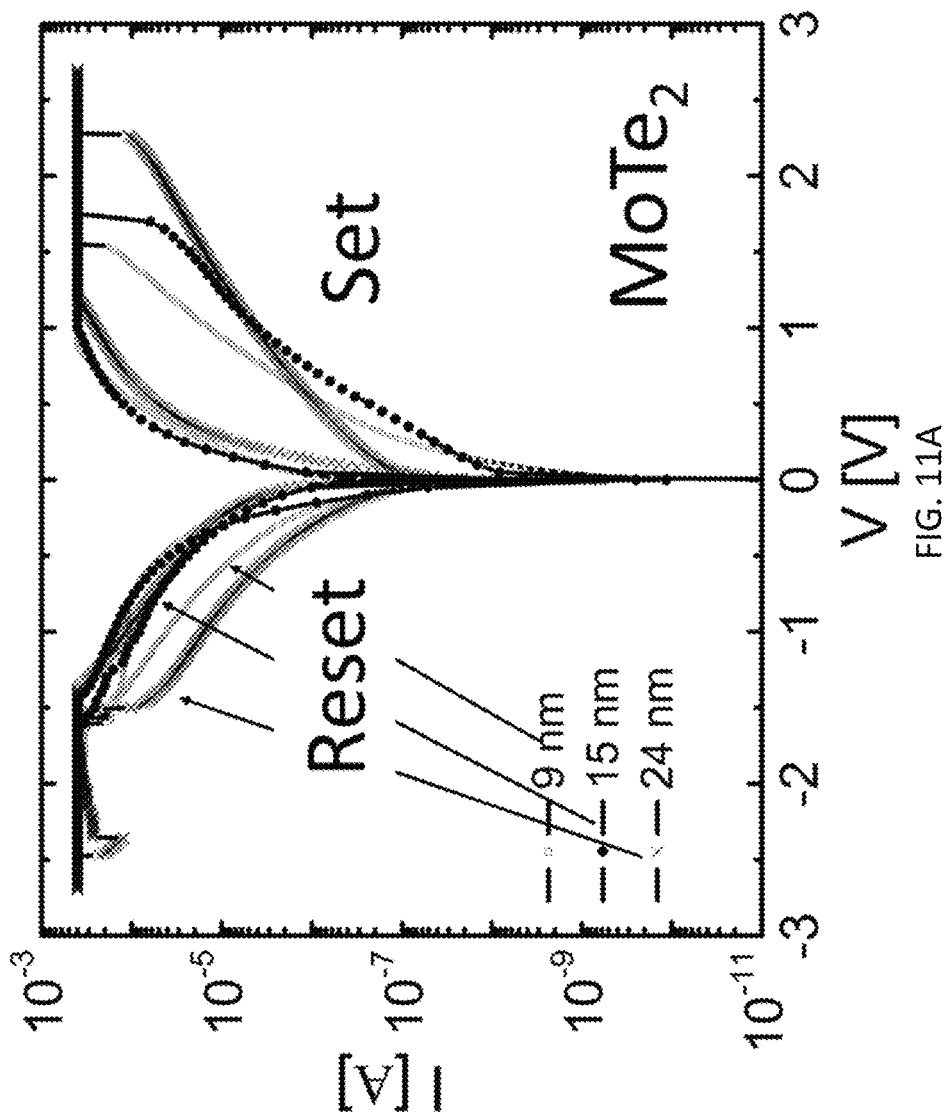
FIG. 11A shows representative IV curves for various $MoTe_2$ thicknesses corresponding to moderate fields.
Figure 11B:
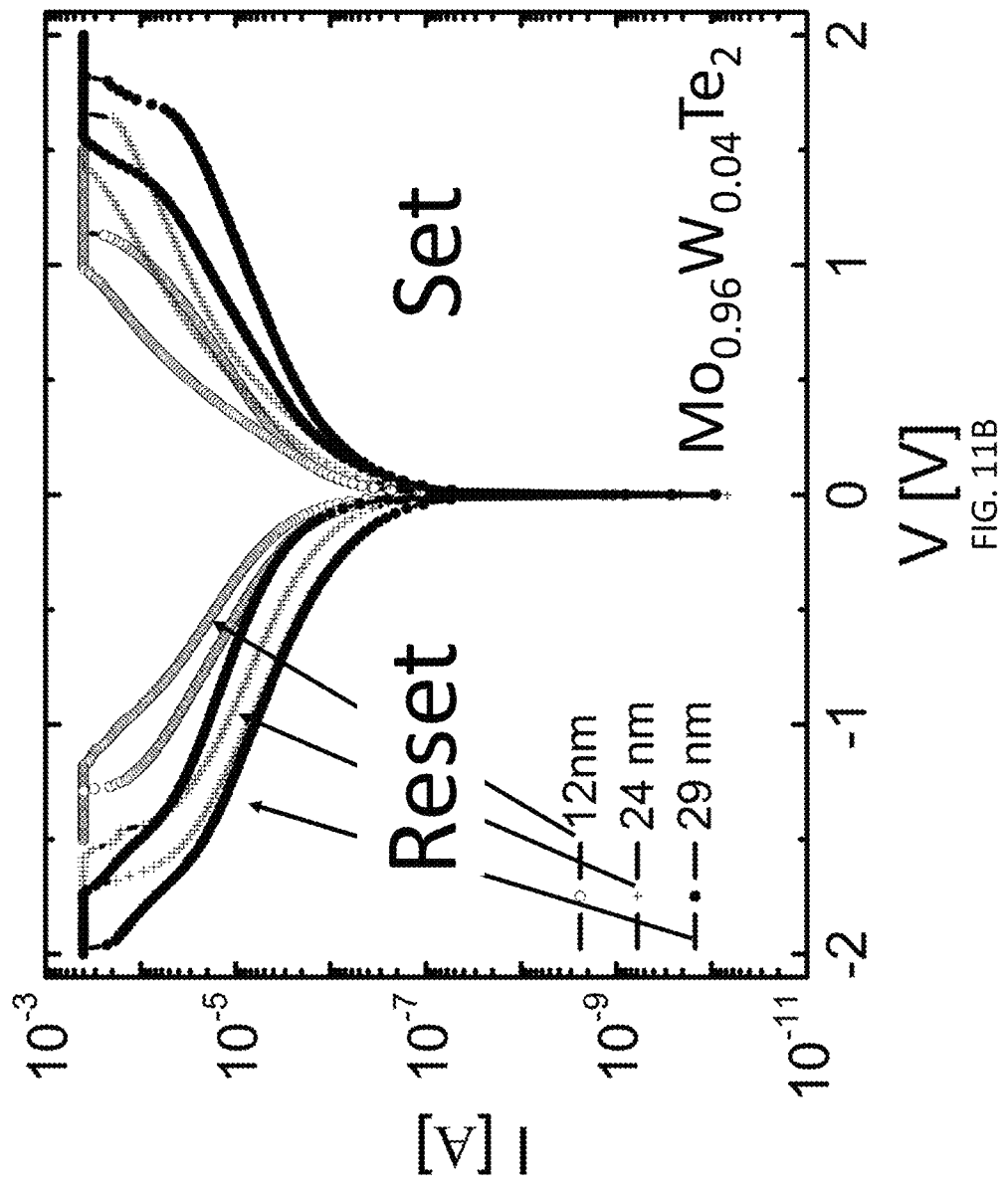
FIG. 11B shows representative IV curve for various $Mo_{0.96}W_{0.04}Te_2$ thicknesses corresponding to moderate fields.

To further understand the switching mechanism in TMDs, exfoliated MoTe$_2$ based RRAM cells with thicknesses between about 6 nm and about 36 nm were fabricated. All cells were nonvolatile and stable. When considering a metal oxide-based RRAM cell, a set current compliance can be used to control the LRS resistance which then determines the diameter and/or the number of conductive filaments formed in the LRS. Conversely, the reset voltage through the modulation of the ruptured filament length can be used to change the HRS resistance. Referring to FIG. 10A, IV curves for different current compliance values (1 mA, 600 µA, and 400 µA) are provided for MoTe$_2$-based RRAM cells. As discussed above, the current compliance is inversely related to the LRS resistance, which means that a higher current compliance results in a lower LRS resistance. In FIG. 10A the flake thickness for the device is about 15 nm. FIG. 10B is a graph of current vs. time (s) which shows the performance of the same device under a 0.5 V read disturb with the current compliance set to 1 mA. As shown, both states show a stable resistance over a period of time (e.g., 1000 s) at room temperature. For flake thicknesses from about 6 nm to about 36 nm, the set voltages can be tuned from 0.9 V to 2.3 V. Referring to FIG. 11A the set voltages in the representative IV curves are shown corresponding to moderate fields in the range of about $10^6$ V/cm. It should be appreciated that the RRAM behavior is independent of the choice of contact metal. As an example, using Ni instead of Ti/Ni as top electrode resulted in the same RRAM performance. Also, as shown in FIG. 11B, IV curves for Mo$_{0.96}$W$_{0.04}$Te$_2$ are provided for different flake thicknesses. While only W$_{0.04}$ constituent is shown in FIG. 11B, other percentages have also been studied, and those percentages can range from about 0 to about 0.09.

Figure 11C:
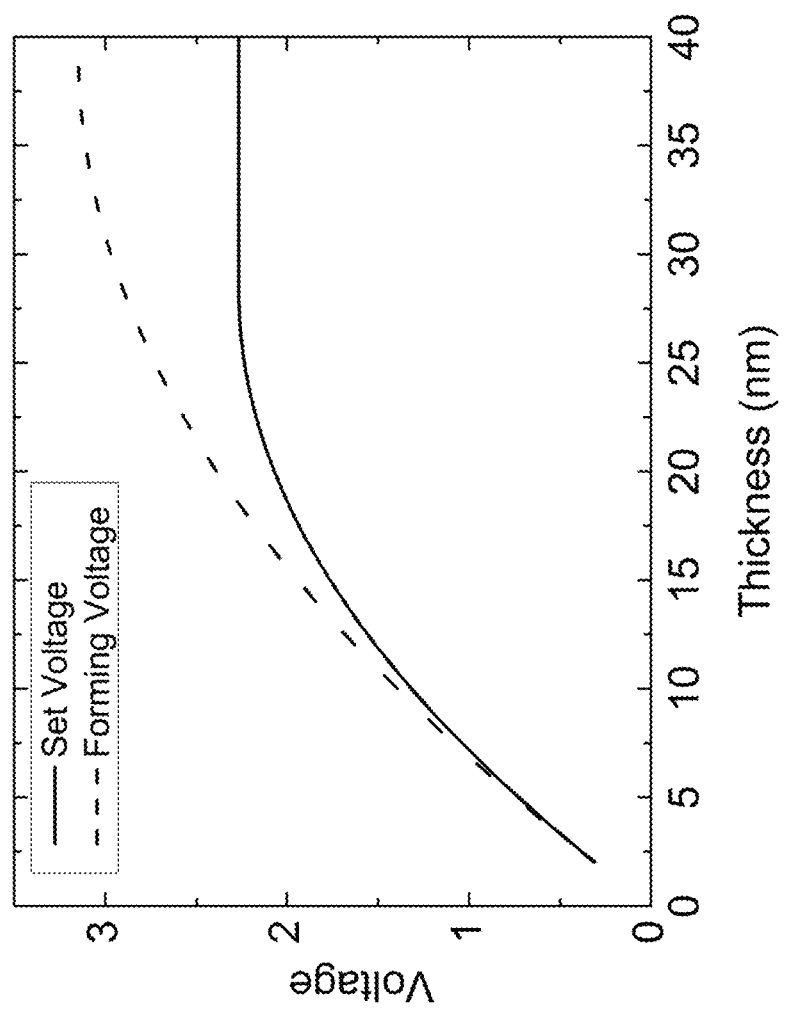
FIG. 11C is a graph of forming/set voltage in volts vs. flake thickness in nm for $MoTe_2$.

The relationship below provides a relationship between forming/set voltage vs. flake thickness which is shown FIG. 11C. The curve fit is based on the following formula:

$$V_{Forming} = E_{CR} \cdot T_{MoTe_2} - qn_1/2k_s\varepsilon_0 T_{MoTe_2}^2,$$

$$V_{Set} = E_{CR} \cdot T_{MoTe_2} - qn_2/2k_s\varepsilon_0 (T_{MoTe_2} - d_{gap})^2,$$

where $V_{Forming}$ is the forming voltage and $V_{set}$ is the set voltage, $E_{CR}$ is electric field and according to one embodiment is about 0.16 V/nm, $d_{Gap}$ represents the distance of ruptured filament during the reset process and according to one embodiment is about 2.1 nm, $K_s$ is relative permittivity and according to one embodiment is about 8 for MoTe$_2$, q is electric charge and is about $1.6 \cdot 10^{-19}$ C, $n_1$ is charge concentration in the MoTe$_2$ material and according to one embodiment is about $1.8 \cdot 10^{24}$ m$^3$, $n_2$ is charge concentration in the formed filament and according to one embodiment is about $2.5 \cdot 10^{24}$ m$^3$, $\varepsilon_0$ is permittivity in vacuum which is about $8.85 \cdot 10^{-14}$ F/cm, and $T_{MoTe_2}$ is the flake thickness which according to one embodiment is between about 0.6 nm and 40 nm. The relationship provided in the above equation can be used to determine $V_{Forming}$ and $V_{Set}$ voltages for differing characteristics.

The impact of the material preparation and composition on RRAM characteristics by extending experiments to 2H—MoTe$_2$ obtained using different approaches and further to 2H—Mo$_{1-x}$W$_x$Te$_2$ alloys were also investigated. One can deduce the observed RRAM effect is not related to the processing conditions by making the observation that MoTe$_2$ devices can be fabricated using either commercial material or crystals synthesized according to this work which utilize different temperatures and transport agents. As such, Mo$_{1-x}$W$_x$Te$_2$ devices exhibit very similar switching behavior and their set voltage characteristics also depend monotonically on the flake thickness as shown in FIG. 11B. Furthermore, observing the set voltages for the Mo$_{1-x}$W$_x$Te$_2$ alloys show a tendency of being smaller than for the MoTe$_2$ devices. This observation implies that the critical electric field needed to trigger the RRAM behavior may have been reduced in alloys.

Figure 12A:
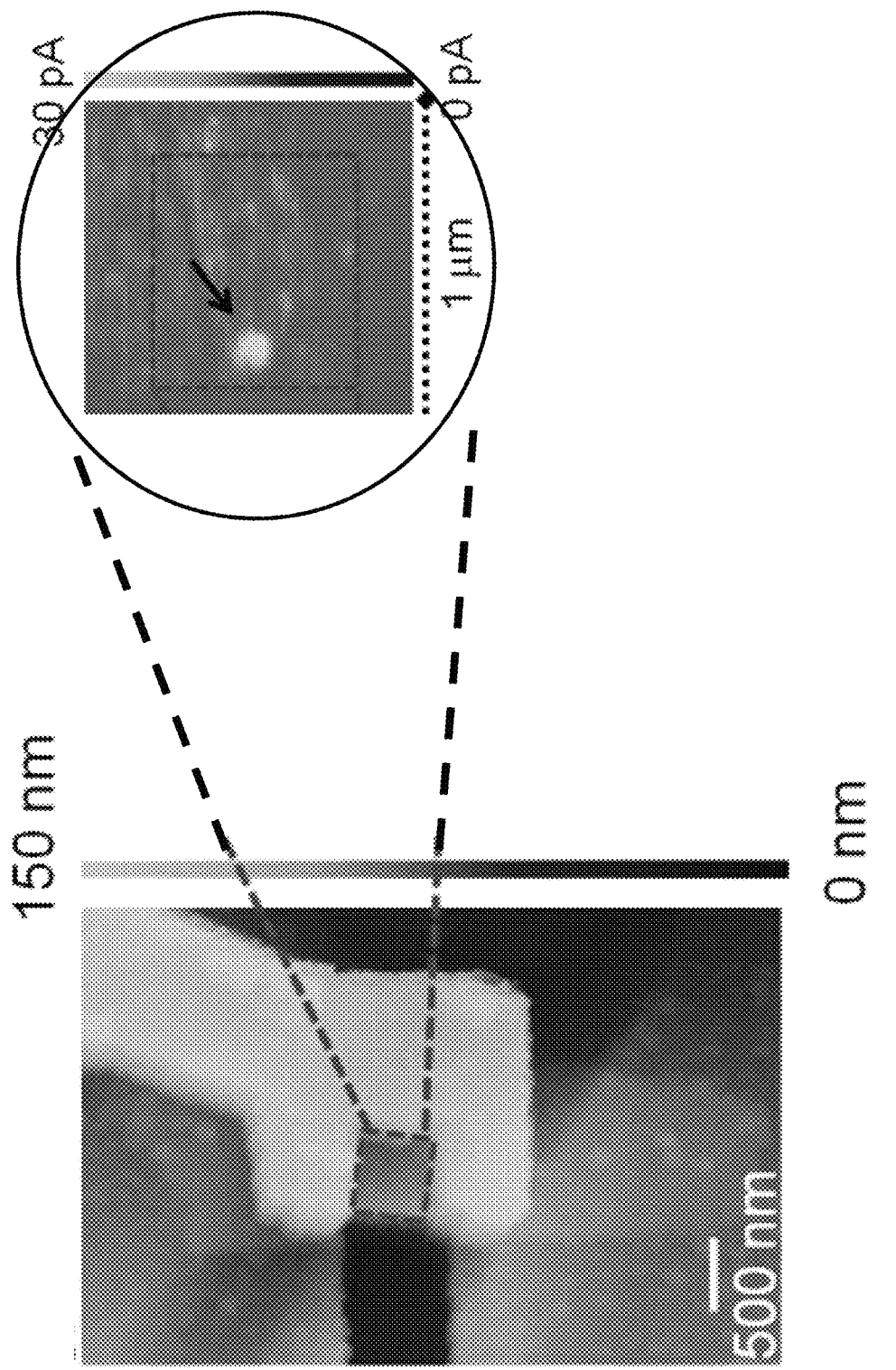
FIG. 12A is a current mapping schematic of a $MoTe_2$ flake after the set process and the formation of the low resistance state (LRS) has occurred using conductive AFM (C-AFM).
Figure 12B:
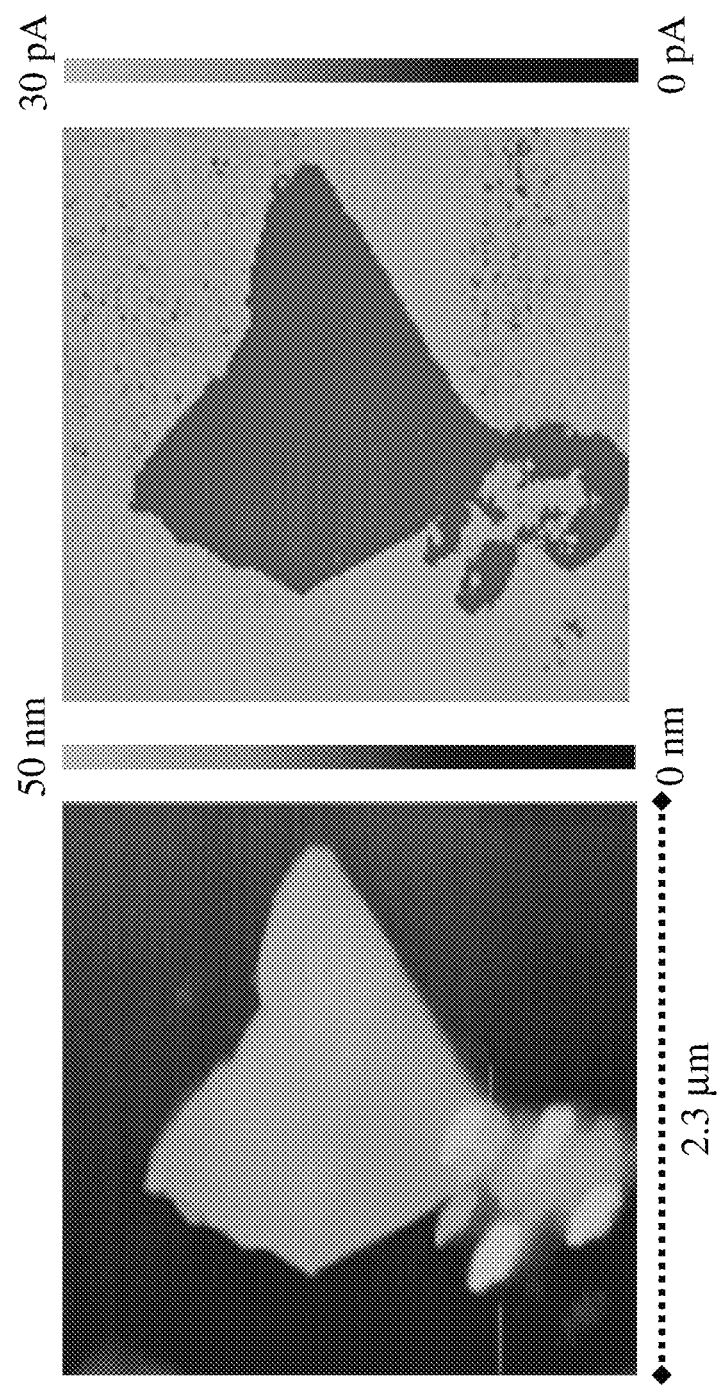
FIG. 12B is a set of C-AFM images of a pristine $MoTe_2$ flake (left: topography and right: current map).

As discussed above, application of an electric bias, results in an electric field and Joule heating inside the sample as part of the electroforming process in RRAM devices. Formation of conductive filaments can result for the LRS from both the field and the heating. However, the HRS is characterized by the absence of these filaments. To confirm formation of these filaments, conductive atomic force microscopy (C-AFM) measurements were carried out for MoTe$_2$ RRAM cells, results of which are shown in FIGS. 12A and 12B. Referring to FIG. 12A, a C-AFM image for current mapping of a MoTe$_2$ flake after the set process and the formation of the LRS has occurred is shown. The dashed square represents the active device area before removal of the top electrode. It should be noted that the bright spot marked with an arrow is the filament. Referring to FIG. 12B, C-AFM images of a pristine MoTe$_2$ flake are provided. In the left panel a topography is shown and in the right panel a current map is shown. These images provide evidence that the aforementioned highly conductive area does not exist in pristine flakes but only in devices that underwent a forming process.

To analyze the formation, first, a fully functional MoTe$_2$ device was biased to form the LRS. Next using a wet chemical etching process as described below the top electrode is removed. This wet etching allows local analysis of the surface resistivity after the filament formation. The inset of FIG. 12A shows a bright spot of about 80 nm in diameter, which is indicative of a current path through the TMD. In contrast, the associated MoTe$_2$ flakes that did not undergo a forming process show a uniform, highly resistive surface as shown in FIG. 12B. The chemical etching process referred to above is described: 1) The etching includes polymethyl methacrylate (PMMA) as etch mask to define the etching area. 2) The etching further includes nickel etchant TFB to etch away the top Ni contact. 3) The etching also includes buffered oxide etch (BOE) to remove the Ti layer to gain access the TMD. The etching process discussed herein did not aversely affect the TMD or result in any other unrelated features to the forming process during the C-AFM measurements that would be unrelated.

Figure 13A:
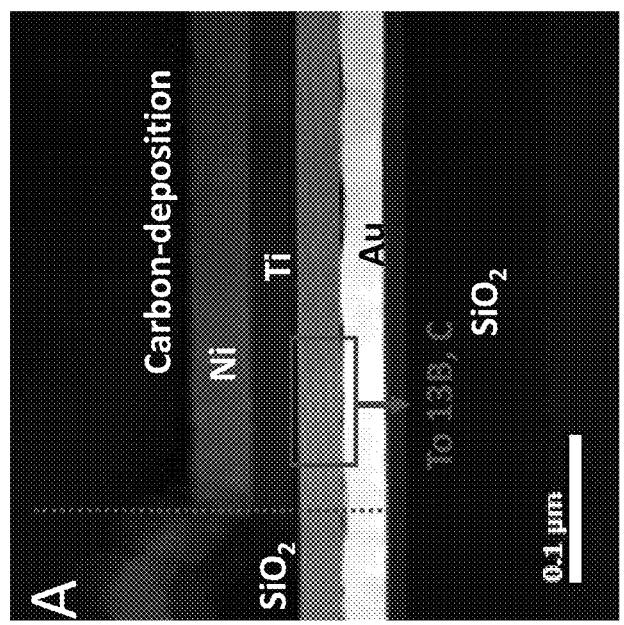
FIG. 13A is a cross-sectional atomic-resolution high-angle annular dark field (HAADF)-STEM image of a $Mo_{0.96}W_{0.04}Te_2$ device.
Figures 13B, 13C, 13D:
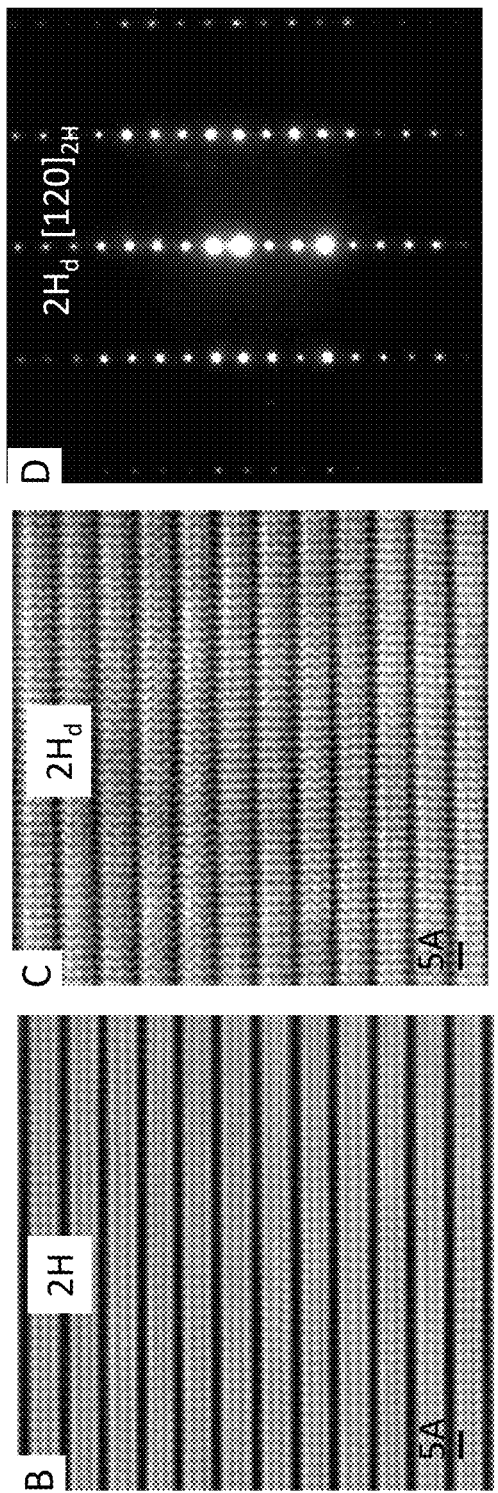
FIGS. 13B and 13C are atomic-resolution HAADF images of the marked box in FIG. 13A taken along the $[120]_{2H}$ zone-axis, showing the intact 2H and distorted $2H_d$ structures, respectively of the $Mo_{0.96}W_{0.04}Te_2$ device.
FIG. 13D shows corresponding nano-beam diffraction (NBD) pattern taken from the distorted $2H_d$ area of the $Mo_{0.96}W_{0.04}Te_2$ device.

Next the inventors of the present disclosure went about to identify the exact nature of the observed phase change. To this end, scanning transmission electron microscopy (STEM) of cross-section of samples were utilized for both $MoTe_2$ and $Mo_{1-x}W_xTe_2$ devices. The same forming process described herein as related to RRAM devices to create filaments in the flakes was undertaken prior to the STEM analysis. FIG. 13A shows a cross-sectional atomic-resolution high-angle annular dark field (HAADF)-STEM image of a $Mo_{0.96}W_{0.04}Te_2$ device. It should be noted that the HAADF-STEM image shown in FIG. 13A displays the TMD flake both in the active Ni/Ti/$Mo_{0.96}W_{0.04}Te_2$/Au/Ti/$SiO_2$ (right side) and non-active region (left side) where an $SiO_2$ isolation layer on top of the TMD prevented RRAM operation. In all cases, the non-active area only exhibited the original 2H phase of $Mo_{0.96}W_{0.04}Te_2$, while, in the active region, two structurally distinct domains are observed—the domains are marked as 2H and 2Hd in FIGS. 13B and 13C, which is a zoom-in HAADF image of the marked box in FIG. 13A. FIG. 13B is an atomic-resolution HAADF image of the 2H region taken along the $[120]_{2H}$ zone-axis with well-resolved atomic columns of Mo/W and Te. FIG. 13C is a structural HAADF image from the 2Hd domain taken along the $[120]_{2H}$ zone-axis. Instead of the well-aligned atomic columns as observed for the 2H structure, the atomic columns of the 2Hd structure shows a distinct 'splitting' for both Te and Mo/W atomic columns, which suggests that the atoms in each atomic column experienced a substantial relative displacement, primarily along the c-direction, upon electric field application. FIG. 13D shows corresponding nano-beam diffraction (NBD) pattern taken from the distorted 2Hd area, which is still indexed as the 2H structure. There are no additional reflections beyond the 2H superlattice reflections observed, suggesting that the 2Hd phase is a distorted metallic modification of the 2H structure, i.e., some transient state with atoms displaced toward one of the lower symmetry structures, but still within the crystal symmetry of the 2H structure.

It can be observed that the phase is reversible and does not involve a change from an amorphous to a crystalline state as typically observed in conventional phase change materials (PCMs). Instead, $MoTe_2$ and $Mo_{1-x}W_xTe_2$ remain crystalline when undergoing the local phase transition from a semiconducting 2H to a metallic 2Hd phase. In comparison to, e.g., $VO_2$ that can also undergo an insulator-to-metal phase transition under an electric field but requires a hold current and exhibits a unipolar switching behavior, the $MoTe_2$ phase transition reported here is bipolar, nonvolatile and it occurs at room-temperature.

Figure 14:
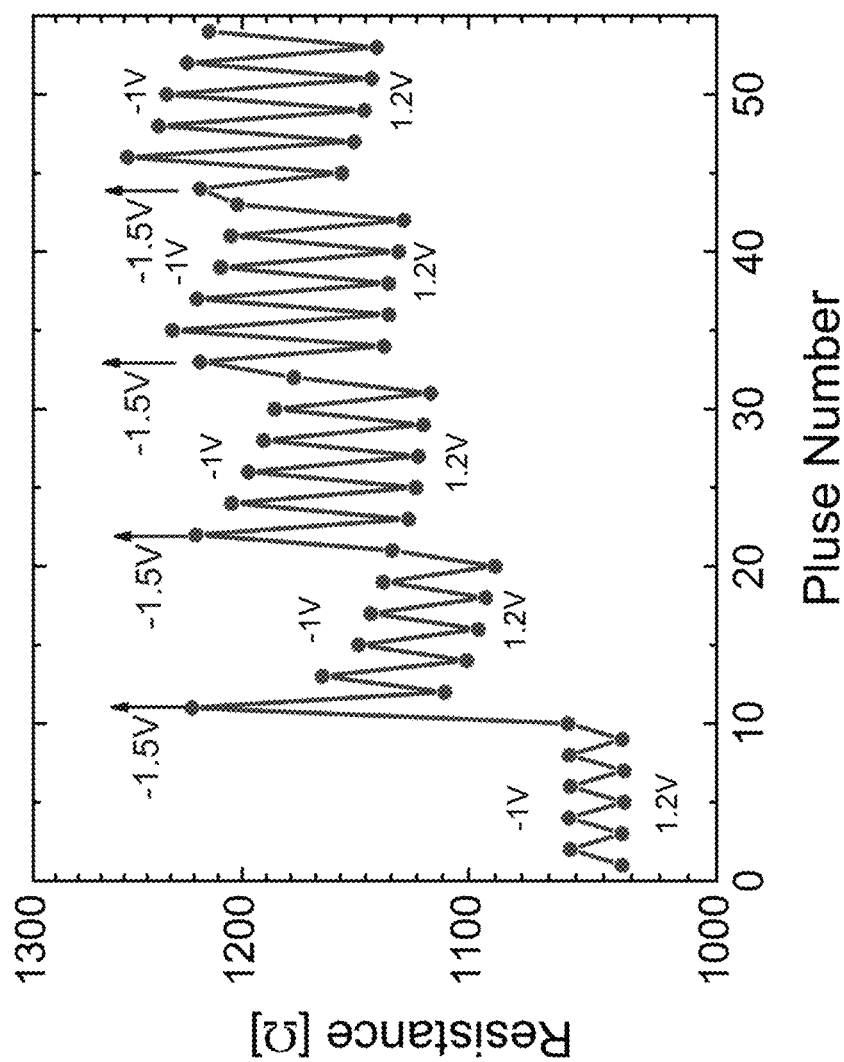
FIG. 14 is a graph of resistance vs. pulse number showing pulse-measurements, where devices were continuously switched between a high resistive and a low resistive state by applying a set and reset voltage of 1.2 V and −1V, respectively.

Next, to further show stability in the electric field induced phases of $MoTe_2$, pulse-measurements were carried out, where devices were continuously switched between a HRS and a LRS as shown in FIG. 14 by applying a set and reset voltage of about 1.2 V and about −1V, respectively. A reproducible set and reset of the device between a low resistance state and high resistance state is achievable when short voltage pulses are used to manipulate the RRAM state. In addition, another pair of stable resistance values can be programmed into the device when higher reset voltages (about −1.5 V) are applied.

Those having ordinary skill in the art will recognize that numerous modifications can be made to the specific implementations described above. The implementations should not be limited to the particular limitations described. Other implementations may be possible.

The invention claimed is:

1. A method of switching a phase-change device, comprising:
    changing phase of a phase-change device (Device) from a semiconducting 2H phase to a new $2H_d$ phase with a higher conductivity, the Device having an active material with a thickness including a phase transition material to thereby transition the Device from a high resistive state (HRS) to a low resistive state (LRS) by application of a set voltage and further to return the Device from the LRS back to the HRS by application of a reset voltage,
    wherein the active material is a phase-change material selected from the group consisting essentially of $MoTe_2$, $Mo_{1-x}W_xTe_2$, GaTe, $ReSe_2$, and $ReS_2$, and
    wherein x of $W_x$ can range from 0 to 0.09.

2. The method of claim 1, wherein the change in phase of the Device is from the 2H unformed phase representing a pristine atomic disposition of the active material to the $2H_d$ formed phase representing a realignment of atoms in the active material and the 2H phase by applying a forming voltage.

3. A method of switching a phase-change device, comprising:
    changing phase of a phase-change device (Device) from a semiconducting 2H phase to a new $2H_d$ phase with a higher conductivity, the Device having an active material with a thickness including a phase transition material to thereby transition the Device from a high resistive state (HRS) to a low resistive state (LRS) by application of a set voltage and further to return the Device from the LRS back to the HRS by application of a reset voltage,
    wherein the active material is a phase-change material selected from the group consisting essentially of $MoTe_2$, $Mo_{1-x}W_xTe_2$, GaTe, $ReSe_2$, and $ReS_2$, and
    wherein when the active material is $MoTe_2$ the set voltage is between about 0.4 V and about 2.3 V for a thickness of between about 3 nm to about 40 nm.

4. The method of claim 3, wherein the change in phase of the Device is from the 2H unformed phase representing a pristine atomic disposition of the active material to the $2H_d$ formed phase representing a realignment of atoms in the active material and the 2H phase by applying a forming voltage.

5. A method of switching a phase-change device, comprising:
    changing phase of a phase-change device (Device) from a semiconducting 2H phase to a new $2H_d$ phase with a higher conductivity, the Device having an active material with a thickness including a phase transition material to thereby transition the Device from a high resistive state (HRS) to a low resistive state (LRS) by application of a set voltage and further to return the Device from the LRS back to the HRS by application of a reset voltage,
    wherein the active material is a phase-change material selected from the group consisting essentially of $MoTe_2$, $Mo_{1-x}W_xTe_2$, GaTe, $ReSe_2$, and $ReS_2$, and wherein the Device further comprising:
a substrate;
a first electrode formed atop the substrate, wherein the active material is formed atop the first electrode;
an isolation layer atop the active material; and
a second electrode formed atop the isolation material,
the substrate is made from material selected form the group consisting of silicon, silicon dioxide, glass, sapphire, germanium, gallium arsenide, indium phosphate, alloys of silicon and germanium, titanium oxide, single polymer, such as polyethylene (PE), biaxially oriented polypropylene (BOPP), polyethylene terephthalate (PET), polyvinyl chloride (PVC), and combinations thereof,
the first and second electrodes are made from material selected from the group consisting essentially of aluminum, copper, gold, silver, polysilicon, molybdenum, nickel, indium tin oxide (ITO), graphene, carbon nanotubes (CNT), silver nanowires (AgNWs), conductive polymer, and combinations thereof,
the isolation is made of a material selected from the group consisting essentially of silicon dioxide ($SiO_2$), boron nitride (BN) or metal oxide material, such as aluminum oxide ($Al_2O_3$), hafnium dioxide ($HfO_2$), or polymers, and combinations thereof,
the isolation layer includes a current path arrangement between the second electrode and the active material, and
the Device further comprising a tunneling barrier layer formed between the first electrode and the active material.

6. The method of claim 5, the current path arrangement including a window.

7. The method of claim 5, the current path arrangement includes a plurality of vias.

8. The method of claim 5, wherein the tunneling barrier layer is made of material selected from the group consisting essentially of silicon dioxide ($SiO_2$), aluminum oxide ($Al_2O_3$), hafnium dioxide ($HfO_2$), boron nitride (BN), other two-dimensional (2D) materials such as $MoS_2$, $WSe_2$, $MoSe_2$, and a combination thereof.

* * * * *